United States Patent
Saouli et al.

[11] Patent Number: 6,094,061
[45] Date of Patent: *Jul. 25, 2000

[54] AUTOMATED TESTING METHOD FOR ELECTRONIC CIRCUITRY

[75] Inventors: Mohamad Ali Saouli, Moreno Valley; Friedrich Stadelmayer, Victorville; Francesco Sacca, Rialto, all of Calif.

[73] Assignee: GTE Communication Systems Corporation, Irving, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/001,833

[22] Filed: Dec. 31, 1997

[51] Int. Cl.[7] .................................................. G01R 31/02
[52] U.S. Cl. ........................................ 324/761; 324/158.1
[58] Field of Search ................................ 324/754, 158.1, 324/755, 758, 757, 761; 209/564, 571; 29/741

[56] References Cited

U.S. PATENT DOCUMENTS

| | | | |
|---|---|---|---|
| 5,055,779 | 10/1991 | Kerschner et al. | 324/754 |
| 5,093,984 | 3/1992 | Lape | 29/741 |
| 5,614,819 | 3/1997 | Nucci | 324/158.1 |
| 5,680,936 | 10/1997 | Beers | 209/564 |
| 5,848,705 | 12/1998 | Gianpaolo et al. | 209/571 |
| 5,862,040 | 1/1999 | Adnan | 361/809 |

*Primary Examiner*—Josie Ballato
*Assistant Examiner*—T. R. Sundaram
*Attorney, Agent, or Firm*—Leonard Charles Suchyta

[57] ABSTRACT

A method for testing printed circuit boards (PCBs). The PCBs are initially transported to a reorienting apparatus that aligns the PCBs to accommodate automated test equipment (ATE). The ATE consists essentially of two stations interconnected by a conveyor. At the first station testing of PCBs occurs sequentially at two test wells that are vertically movable between respective idle and testing positions. Upon being discharged from the first test station, a predetermined number of PCBs are concatenated along the conveyor that connects the first test station to the second test station. The concatenated PCBs are delivered to the second test station that simultaneously performs a second test on the predetermined number of PCBs. Inasmuch as the first test is of a duration substantially shorter than the second test, the concatenation of a number of PCBs prior to performance of the second test compensates for the difference in respective durations.

21 Claims, 5 Drawing Sheets

FIG. 3C

AUTOMATED TESTING METHOD FOR ELECTRONIC CIRCUITRY

FIELD OF THE INVENTION

The subject invention relates to a method for testing electronic circuitry and, more particularly, to a method for sequentially performing continuity testing at a first test station and, subsequently, simultaneously performing, on a predetermined number of printed circuit boards, functional testing at a second test station.

BACKGROUND OF THE INVENTION

As the complexity of electronic equipment, especially computer-controlled or microprocessor-based, equipment, evolves, the requirements associated to testing such equipment escalate. Consequently, the direct and indirect costs of necessary test operations become a significant component of the cost of manufacturing or repairing the equipment Testing costs may be manifest in numerous ways: the cost of acquiring and maintaining test equipment and test systems; the time occupied in performing testing procedures; and, less frequently recognized, the amount of manufacturing floor space occupied by the test equipment and system.

Accordingly, it is an object of this invention to provided testing apparatus and method that readily accommodate the testing of various kinds of electronic equipment.

It is another object of this invention that the testing take advantage of proven, required or available automated test equipment (ATE).

It is a further object of this invention that the expense of acquiring and maintaining test equipment be minimized.

It is an additional object of this invention that the test equipment efficiently occupy the manufacturing floor space available.

SUMMARY OF THE INVENTION

The above and other objects, advantages and capabilities are achieved in one aspect of the invention by a method for testing printed circuit boards (PCBs) are initially transported to a reorienting apparatus for alignment with automated test equipment (ATE). Reorientation of the PCBs is effected through a rotating apparatus that imparts a 90° reorientation of the PCBs. The PCBs are sequentially tested in dual test wells at the first test station. After sequential testing at a first test station, a predetermined number of PCBs are concatenated for simultaneous testing at second station. Because testing at the first test station is of a duration shorter than the duration of the testing at the second test station, a predetermined number of PCBs are concatenated on a conveyor that connects the first test station to the second test station. At the second test station, the predetermined number of PCBs are tested by simultaneously applying the PCBs to a corresponding number of identical test heads that are respectively coupled to ATE.

BRIEF DESCRIPTION OF THE DRAWINGS

A thorough understanding of the present invention may be had by referring to the detailed Description when considered in connection with the Drawings described below, wherein like reference numbers refer to similar elements throughout, and wherein:

FIG. 1, including FIGS. 1A (side view) and 1B (top view), depict a test station 3 for performing sequential testing, a test station 5 for performing simultaneous testing, and a conveyor 4 interconnecting the two above-referenced test station;

FIG. 3, including

DESCRIPTION OF THE BEST MODE FOR CARRYING OUT THE INVENTION

For a thorough understanding of the subject invention, reference is made to the following Description, in connection with the above-described Drawings and the appended claims.

Figure 1A:
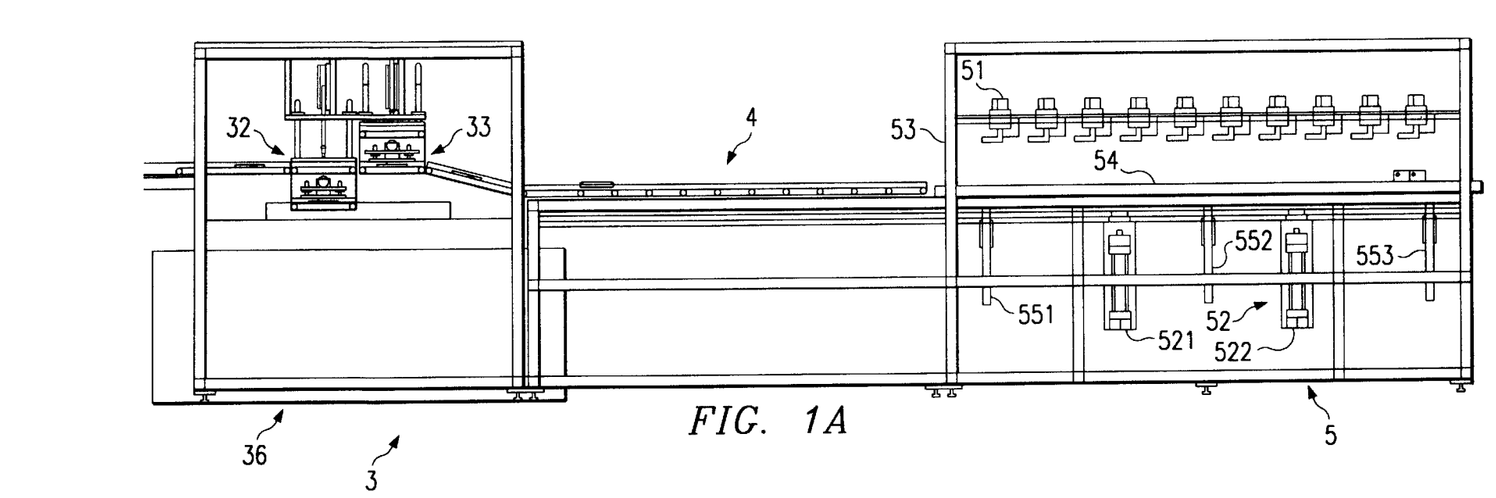
Figure 1B:
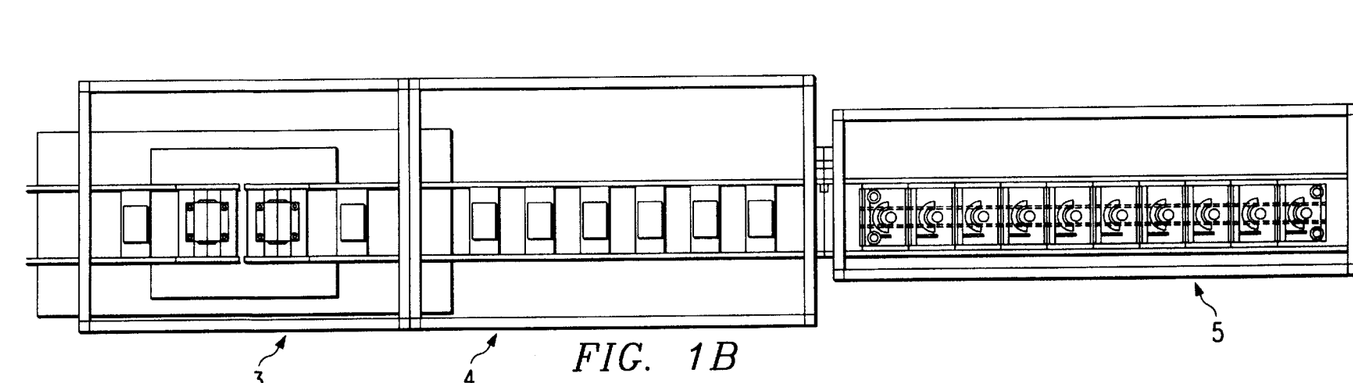

Attention is first directed to FIG. 1, including FIGS. 1A (side view) and 1B (top view), which is an illustration of a test station to be used in connection with automated test equipment (ATE) for testing printed circuit boards (PCBs).

As depicted in FIG. 1, the test station includes a first test station 3 for use with ATE 36. Test station 3, more fully described below, includes dual test wells 32 and 33 that are used to facilitate sequential testing of PCBs 11 via ATE 36. Test station 3 is connected, via an interconnection conveyor 4, to a second test station 5. At test station 5, a predetermined number of PCBs are loaded into the test station and are simultaneously tested. In accordance with the embodiment of the invention contemplated here, test station 3 facilitates an "in-circuit," or continuity, test of the PCBs, and test station 5 facilitates a functional test of the PCBs.

As an operation preliminary to the testing of PCBs at test station 3, the PCBs are reorientated from the orientation at which they had been proceeding on the test line to the orientation in concinnity with the ATE. In this regard, it is to be understood that the PCBs generally travel in a linear path through the ATE and various associated test stations. Because it is desirable to maintain this path of travel, and because transport or testing prior to station 3 renders the PCBs in an orientation that discommodes testing at test station 3, it is required that the PCBs be reorientated prior to their application to station 3. Accordingly, it is an aspect of this subject invention to provide a novel reorienting apparatus, and such is depicted in FIG. 2.

Figure 2:
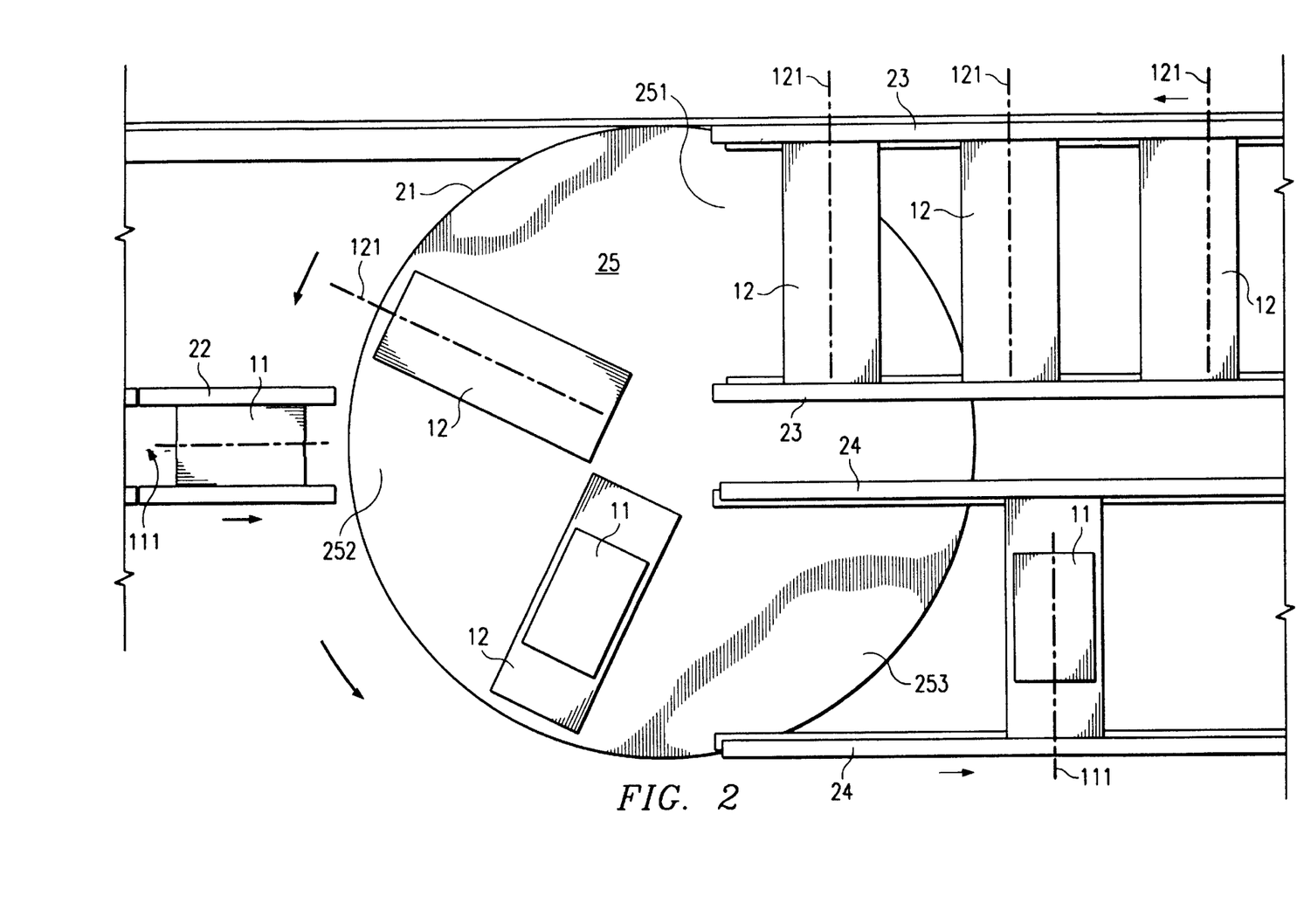
FIG. 2 is a top view of a reorienting apparatus that reorients printed circuit boards for proper alignment with the test stations and automated test equipment associated therewith.

Referring now to FIG. 2, depicted therein is an apparatus for reorienting PCBs to an input of ATE for various tests to be conducted on the PCBs. As shown in FIG. 2, the PCBs 11 are initially oriented with a major axis 111 orientated in a horizontal direction, that is, along the direction of travel of a conveyor 22. With respect to the embodiment of the invention illustrated in FIG. 2, conveyor 22 transports PCBs 11 in a left-to-right (east-to-west) direction. Similarly, a second conveyor 23 transports rectangular pallets 12 in the opposite direction. Pallets 12 have a major axis 121 oriented in a direction orthogonal to the direction of travel of conveyor 23. As illustrated in the embodiment of FIG. 2, conveyor 23, and, concomitantly, pallets 12 travel in a right-to-left (east-to-west) direction.

As may be seen from FIG. 2, conveyor 23 deposits pallets 12 at a first position on a rotating table 25. Table 25 may rotate in a counterclockwise fashion. Similarly, conveyor 22 deposits the PCBs at a position 252 on the rotation table 25. Pallets 12 are rotated through an angle of approximately 90° from position 251 to position 252. At position 252, pallets 12 are merged with PCBs 11 so that the PCBs are supported by the upper surface of the pallets. Subsequently, the merged PCBs and pallets are rotated, in a counterclockwise direction, through a radial angle of approximately 90°, where they are delivered to a conveyor 24 that transports the palletized PCBs to an input of the ATE. Conveyor 24 travels in a direction parallel to, but opposite from, the direction of travel conveyor 23. In a manner described above, the PCBs are reorientated, specifically, major axis 111 is rotated through an angle of 90°, which maintains the direction of travel of the PCBs, while effecting the proper orientation to the input of the ATE shown in FIG. 3.

Figure 3A:
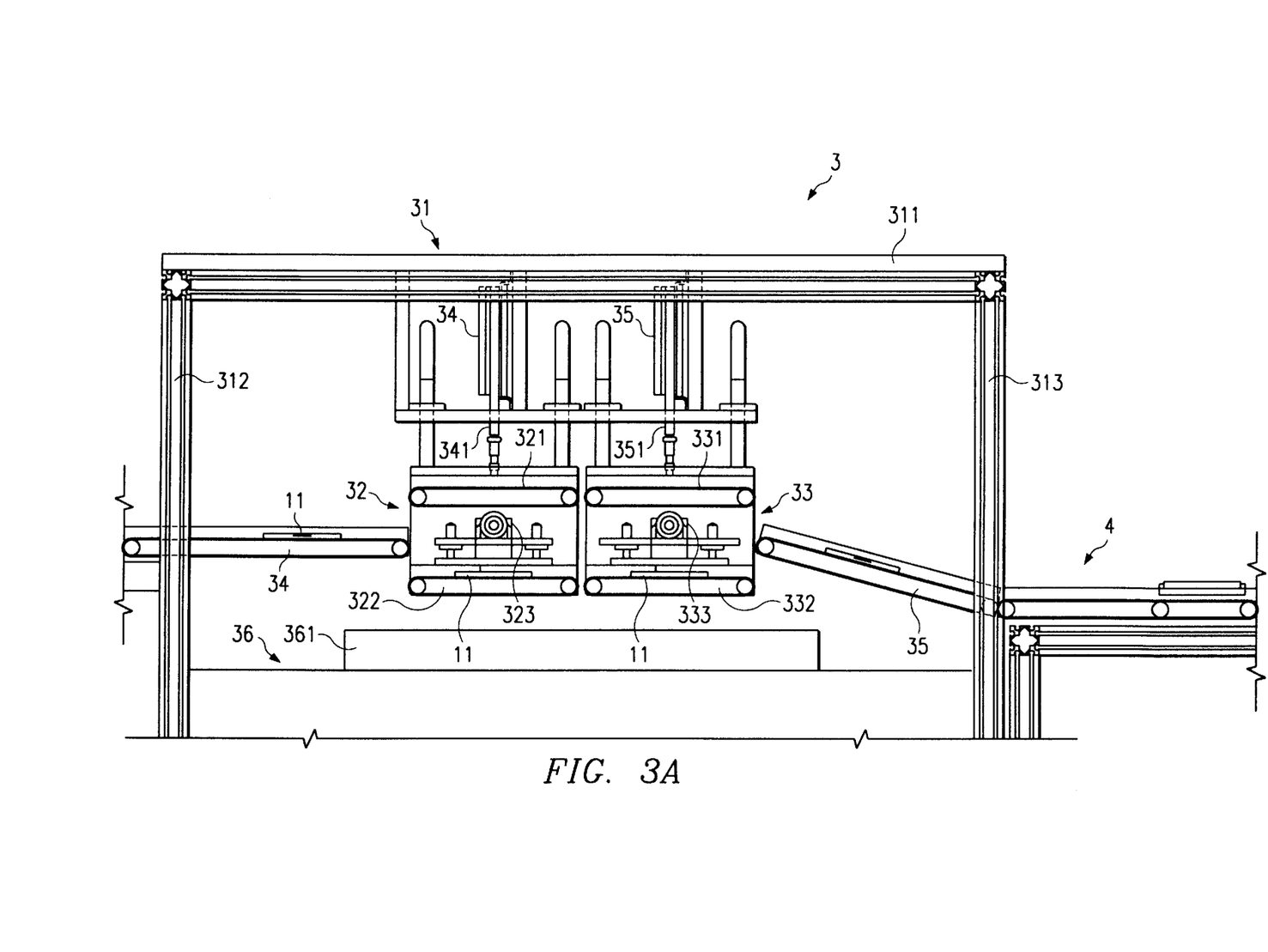
FIGS. 3A, 3B and 3C, depict test station 3 in various phases of sequential testing.

Referring now to FIG. 3, depicted therein is a test station 3 for use with ATE, which, in an exemplary embodiment may be a Model HP-3070, available from Hewlett Packard Company. In a manner that will be apparent from the description below, the test station operates in conjunction with the ATE to sequentially perform tests on PCBs 11. The PCBs are transported to test station 3 from the reorienting apparatus described above and illustrated in FIG. 2.

Test station 3 comprises a support frame 31 having a roof 311 and upright members 312 and 313. The support frame 31 supports and, to a degree, encloses a pair of substantially identical test wells 32 and 33. The test wells include respective upper conveyor segments 321 and 331, respective lower conveyor segments 322 and 332, and respective test heads 323 and 333. As shown in FIG. 3, the test heads are disposed in the test wells between the upper conveyor segments and the lower conveyor segments. The specific constituent components of the test head are not germane to the invention. Suffice it to say that the test head contain active or passive circuitry necessary to perform the tests to be performed on the PCBs. The tests here, then, are designed in response to the design of the PCBs.

The test wells are themselves coupled to roof 311 by pneumatic actuators 34 and 35. The actuators include respective vertically orientated rods 341 and 351 that are attached to test wells 32 and 33 and operate to move the test wells between an idle position in the direction of roof 311 and a testing position in proximity with the ATE.

Test station 3 also includes an input conveyor segment 34 for transporting PCBs to the test wells and an output conveyor segment for removing tested PCB from the test well.

Figure 3B:
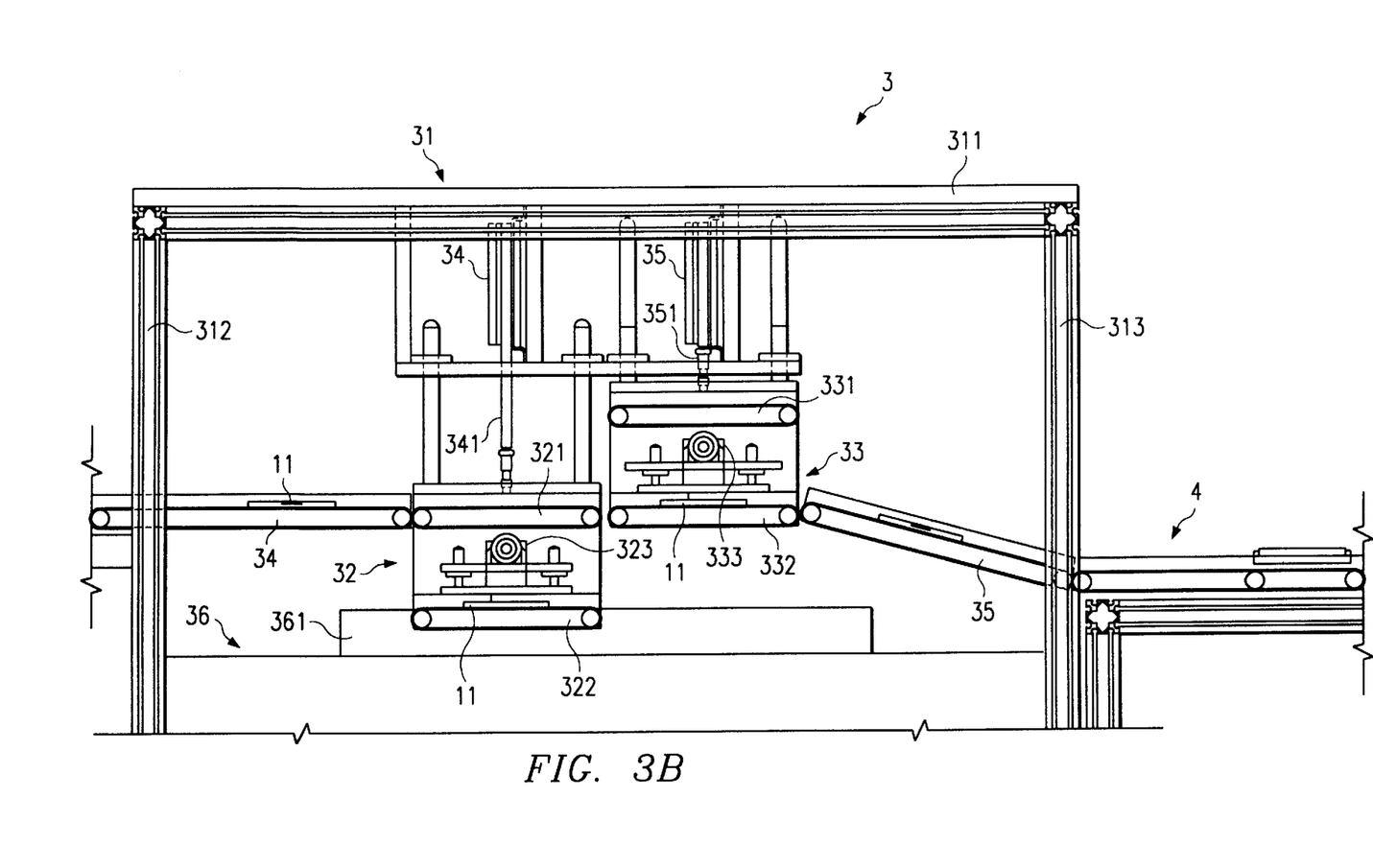

Test wells 32 and 33 operated to sequentially test PCBs in the manner described immediately below. FIG. 3B depicts a phase of the testing cycle in which test well 32, by virtue of extension of rod 341, is disposed in a testing position, that is, in proximity with test platform 361 of the ATE. In this phase of the test cycle test well 32 is raised to a position in the direction of roof 311. Accordingly, input conveyor segment 34, upper conveyor segment 321 of test well 32, lower conveyor segment 332 of test well 33, and output conveyor segment 35 are in alignment.

Figure 3C:
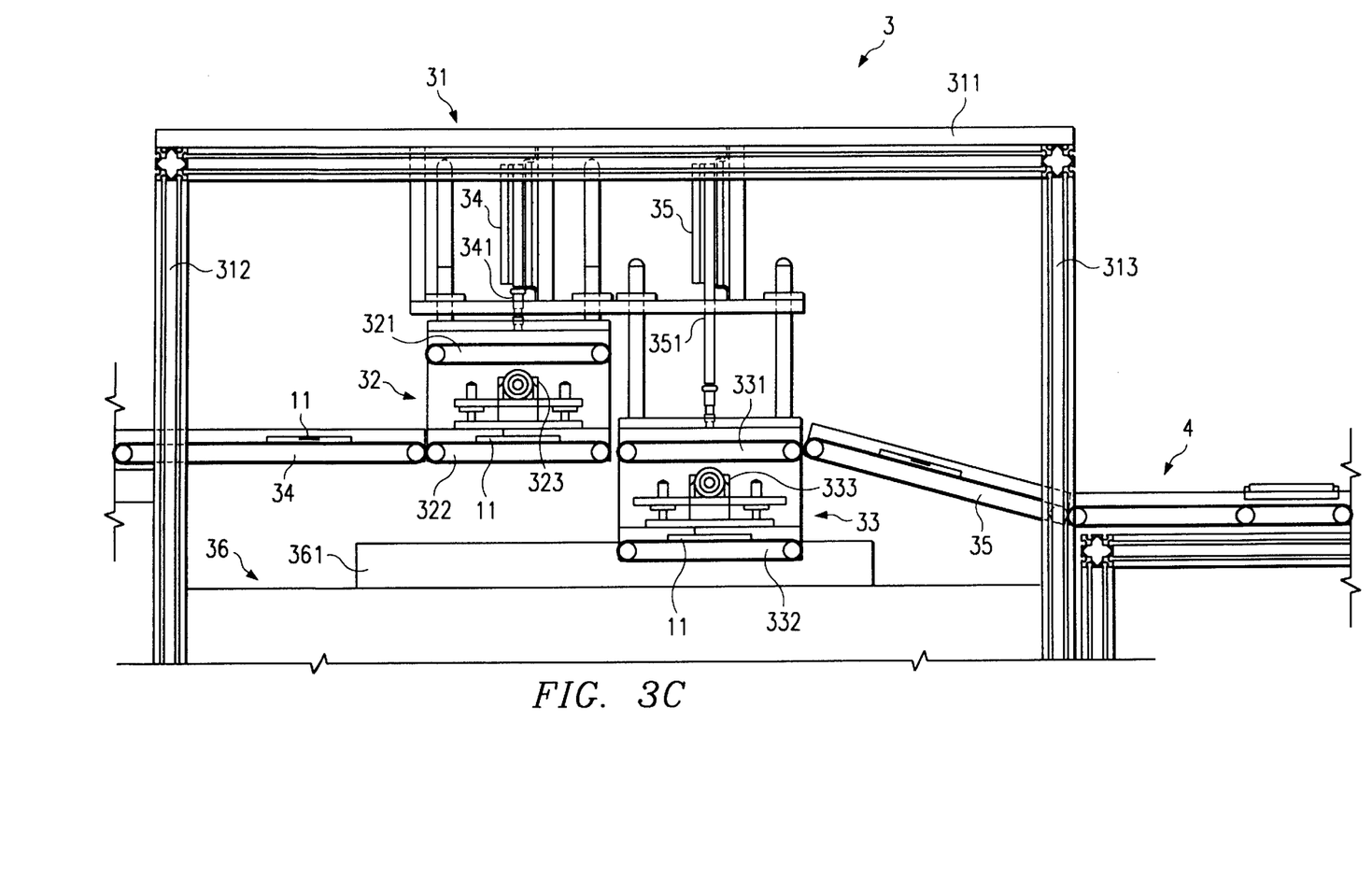

In another phase of the testing cycle, depicted in FIG. 3C, in which test well 33 is disposed in the testing position and test well 32 is raised to the idle position. In this phase input conveyor segment 34, lower conveyor or segment 322 of test well 32, upper conveyor segment 331 of test well 33, and output conveyor segment 35 are in alignment. Accordingly, the PCB positioned in test well 33 is disposed in proximity with platform 361 for testing by ATE. In the course of testing by test well 33, the PCB tested immediately previously by test well 32 is transported from conveyor segment 322, across conveyor segment 331, to output conveyor segment 35. Output conveyor segment 35 delivers PCBs to the interconnection conveyor.

Sequential testing of PCBs in test station 3 occurs as follows. Assume, for pedagogical purposes, that both test wells 32 and 33 are initially raised to the idle position. A PCB is transported from input conveyor segment 34 to lower conveyor segment 322 of test well 32. Test well 32 is lowered to the testing position, and another PCB may be transported from input conveyor segment 34, across upper conveyor segment 332 of test well 33. After testing by the ATE of the PCB in test well 32, test well 32 is raised to the idle position, and test well 33 is lowered to the testing position. With test well 33 in the testing position, the PCB in test well 32 is transported by conveyor segment 322, across conveyor segment 331 to output segment 35, and is removed from test station 3. After testing is completed on the PCB in test well 33, test well 33 is raised to the idle position, and the PCB in test well 33 is transported by conveyor segment 332 to output conveyor 35.

Referring once more to FIG. 1, upon being discharged from test station 3, PCBs are concatenated on interconnecting conveyor 4. In a preferred embodiment of the invention, concatenation of PCBs on conveyor 4 is achieved by interlocking the pallets on which the PCBs are transported. Specifically, because in a specific embodiment of the invention, the duration of testing at test station 3 is shorter than the duration of testing at a subsequent test station 5, a predetermined number of PCBs may be concatenated for simultaneous test (described below) at station 5. The predetermined number compensates for the difference in the duration of testing at the two test stations. The predetermined number of PCBs are transported, in unison, to test station 5.

For purposes of illustration, ten (10) PCBs are shown as interconnected on conveyor 4. The PCBs are transported by conveyor 4 onto platform 54 of test station 5. Once positioned on platform 54, the PCB are simultaneously elevated by a pair of actuators 521 and 522 for engagement by ten test heads 51. The test heads are connected to ATE (not shown) for appropriate functional testing. Precise registration of the PCBs to the respective associated test heads is promoted by three registration rods 551, 552 and 553. The PCBs are simultaneously tested and, upon completion of testing moved out of test station 5 for subsequent testing or other operations in the manufacturing process.

Accordingly, although there has been described above a preferred embodiment of a method for testing PCBs or other electronic circuitry, those having ordinary skill in the art will realize that various changes and modifications may be made to the embodiments of the invention described herein without departure from the scope of the invention as defined by the appended claims.

We claim:

1. A method for testing printed circuit boards (PCBs), the method comprising the steps:

transporting the PCBs to a reorienting apparatus;

reorienting the PCBs for alignment with automated test equipment (ATE);

transporting reoriented PCBs to the ATE;

performing a first test on the PCBs at a first ATE station;

discharging the PCBs form the test station;

concatenating a predetermined number of PCBs;

inputting the predetermined number of PCBs to a second test station of the ATE; and     performing second tests on the predetermined number of PCBs simultaneously at a second test station of the ATE.

2. A method for testing PCBs as defined in claim 1, wherein testing at the first test station is performed sequentially at at least two test wells as follows:

(i) a first PCB is loaded into a first well;

(ii) the first test well is moved vertically into a testing position;

(iii) a second PCB is loaded into a second test well;

(iv) testing is performed on the first PCB;

(v) the first test well is moved vertically to an idle position;

(vi) the second test well is moved vertically into a testing position;

(vii) testing is performed on the second PCB; and (viii) the first PCB is discharged from the first test station.

3. A method for testing PCBs as defined in claim 2, wherein step (v) and step (vi) occur concurrently and wherein step (vii) and step (viii) occur concurrently.

4. A method for testing PCBs as defined in claim 2, wherein the first PCB is transported through the second test well prior to being discharged from the test station.

5. A method of testing PCBs as defined in claim 1, wherein the PCBs are reoriented for alignment with the ATE as follows;

(i) a first conveyor deposits pallets to a first position on the reorienting apparatus;

(ii) a second conveyor deposits PCBs to second position on the reorienting apparatus;

(iii) PCBs are merged with the pallets at the second position on the reorienting apparatus; and (iv) merged PCBs and pallets are reoriented prior to being transported to the ATE so that alignment of the PCBs during transportation to the ATE is substantially different from alignment of the PCBs upon being deposited to the second position on the reorienting apparatus.

6. A method of testing PCBs as defined in claim 5, wherein the merged PCBs and pullets are rotated through an angle of approximately 90° between the second position on the reorienting apparatus and an input of the ATE.

7. A method of testing PCBs as defined in claim 6 and wherein the pallets are rotated through an angle of approximately 90° between the first position on the reorienting apparatus and the second position on the reorienting apparatus.

8. A method as defined in claim 7, wherein a third conveyor transports the merged PCBs and pallets to the ATE and wherein the third conveyor travels in a direction substantially parallel to but opposite from a direction traveled by the first conveyor.

9. A method for testing PCBs as defined in claim 8, wherein testing at the first test station is performed sequentially at at least two test wells as follows:

(i) a first PCB is loaded into a first test well;

(ii) the first test well is moved vertically into a testing position;

(iii) a second PCB is loaded into a second well;

(iv) testing is performed on the first PCB;

(v) the first test well is moved vertically to an idle position;

(vi) the second test well is moved vertically into a testing position;

(vii) testing is performed on the second PCB; and (viii) the first PCB is discharged from the first test station.

10. A method for testing PCBs as defined in claim 9, wherein step (v) and step (vi) occur concurrently and wherein step (vii) and step (viii) occur concurrently.

11. A method for testing PCBs as defined in claim 10, wherein the first PCB is transported through the second test well prior to being discharged from the test station.

12. A method of testing PCBs as defined in claim 11, wherein the predetermined number of PCBs are concatenated by interlocking pallets.

13. A method of testing PCBs as defined in claim 12, wherein the first test of a duration shorter than the duration of the second test and the predetermined number compensates of the difference in the respective durations.

14. A method of testing printed circuit boards (PCBs) at at least two test stations, the method comprising the steps:

sequentially testing PCBs at two test wells in the first test station;

concatenating a predetermined number of PCBs along conveyor that interconnects the first test station with the second test station; and simultaneously testing the predetermined number of PCBs at the second test station.

15. A method of testing PCBs as defined in claim 14, wherein duration of testing at the first station is longer than duration of testing at the second station and concatenation of the predetermined number of PCBs compensates for the difference in the respective durations.

16. A method for testing PCBs as defined in claim 15, wherein testing at the first test station is performed as follows:

(i) a first PCB is loaded into a first test well;

(ii) the first test well is moved vertically into a testing position;

(iii) a second PCB is loaded into a second test well;

(iv) testing is performed on the first PCB;

(v) the first test well is moved vertically to an idle position;

(vi) the second test well is moved vertically into a testing position;

(vii) testing is performed on the second PCB; and (viii) the first PCB is discharged from the first test station.

17. A method for testing PCBs as defined in claim 16, wherein step (v) and step (vi) occur concurrently and wherein step (vii) and step (viii) occur concurrently.

18. A method for testing PCBs as defined in claim 17, wherein the first PCB is transported through the second test well prior to being discharged from the test station.

19. A method of testing PCBs as defined in claim 14, wherein prior to testing the PCBs are reoriented for alignment with the test stations as follows:

(i) a first conveyor deposits pallets to a first position on a reorienting apparatus;

(ii) a second conveyor deposits PCBs to a second position on the reorienting apparatus;

(iii) PCBs are merged with he pallets at the second position on the reorienting apparatus; and;

(iv) merged PCBs and pallets are reoriented prior to being transported to the first test station so that alignment of the PCBs during transportation to the first test station is substantially different from alignment of the PCBs upon being deposited to the second position on the reorienting apparatus.

20. A method of testing PCBs as defined in claim 19, wherein duration of testing at the first station is longer than duration of testing at the second station and concatenation of the predetermined number of PCBs compensates for the difference in the respective durations.

21. A method of testing printed circuit boards (PCBs) at a test that includes at least two test wells, the method comprising the steps:

(i) loading a first PCB into a first test well;
(ii) moving the first test well vertically into a testing position;
(iii) loading a second PCB into a second test well;
(iv) performing a test on the first PCB;
(v) moving the first test well vertically to an idle position;
(vi) moving the second test well vertically into a testing position;
(vii) performing a test on the second PCB; and
(viii) discharging the first PCB from the test station.

* * * * *

UNITED STATES PATENT AND TRADEMARK OFFICE
CERTIFICATE OF CORRECTION

PATENT NO : 6,094,061
DATED : July 25, 2000
INVENTOR(S) : Mohamad Ali Saouli, et al.

It is certified that error appears in the above-identified patent and that said Letters Patent are hereby corrected as shown below:

Title page, item [75] should read as follows, an inventor having been removed:

Mohamad Ali Saouli, Moreno Valley;
    Francesco Sacca, Rialto, all of Calif.

Signed and Sealed this

Seventeenth Day of April, 2001

*Attest:*

NICHOLAS P. GODICI

*Attesting Officer*      Acting Director of the United States Patent and Trademark Office